United States Patent [19]

Nagano et al.

[11] 3,943,547

[45] Mar. 9, 1976

[54] SEMICONDUCTOR DEVICE

[75] Inventors: Takahiro Nagano; Tatsuya Kamei; Takuzo Ogawa, all of Hitachi, Japan

[73] Assignee: Hitachi, Ltd., Japan

[22] Filed: Dec. 3, 1973

[21] Appl. No.: 421,265

Related U.S. Application Data

[63] Continuation-in-part of Ser. No. 207,878, Dec. 14, 1971, abandoned.

[30] Foreign Application Priority Data

Dec. 26, 1970 Japan .............................. 45-118708

[52] U.S. Cl. ...................... 357/38; 357/54; 357/55; 357/56

[51] Int. Cl.² .................. H01L 29/743; H01L 29/06

[58] Field of Search ................ 317/235 AB, 235 AJ; 357/38, 54, 55, 56

[56] References Cited

UNITED STATES PATENTS

| | | | |
|---|---|---|---|
| 3,437,886 | 4/1969 | Edquist et al. | 317/235 AJ |
| 3,491,272 | 1/1970 | Huth et al. | 317/235 AB |
| 3,611,554 | 10/1971 | Garrett | 317/235 AJ |
| 3,648,340 | 3/1972 | MacIver | 317/234 UA |

FOREIGN PATENTS OR APPLICATIONS

| | | | |
|---|---|---|---|
| 2,164,660 | 7/1972 | Germany | 357/38 |

*Primary Examiner*—William D. Larkins
*Attorney, Agent, or Firm*—Craig & Antonelli

[57] ABSTRACT

A semiconductor device comprising a semiconductor substrate including at least three layers of alternating conductivity between a pair of principal surfaces, the side surface of said semiconductor substrate being formed in pulley-shape and the depth of the valley of the pulley-shape being selected from the most appropriate numerical range related with the dielectric constant of the surrounding medium and the thickness of the semiconductor substrate.

12 Claims, 6 Drawing Figures

SEMICONDUCTOR DEVICE

CROSS-REFERENCE TO RELATED APPLICATION

This is a continuation-in-part of application Ser. No. 207,878, filed Dec. 14, 1971, now abandoned.

BACKGROUND OF THE INVENTION

1. Field of the Invention

This invention relates to a semiconductor device.

2. Description of the Prior Art

Generally, for increasing the blocking voltage (the breakover voltage in the forward direction and the breakdown voltage in the reverse direction) of semiconductor devices such as diodes and thyristors, a very important problem exists in the surface state of semiconductor substrates where a PN junction is exposed. A semiconductor substrate surface is very active and easily influenced by the ambient atmosphere. If moisture and/or ionizable material exist in the atmosphere, they adhere to the substrate surface and make the surface field intensity larger than the field intensity in the semiconductor substrate. Thus, the blocking voltage of a semiconductor device is influenced by the surface state of the semiconductor substrate.

For providing good reproducibility in the blocking voltage of semiconductor devices, it is necessary to arrange that the blocking voltage of a semiconductor device be determined by that of the semiconductor substrate which is simply determined by the impurity concentration. For achieving this, the surface field intensity of a semiconductor substrate should be sufficiently smaller than the field intensity in the substrate. It is known that for decreasing the surface field intensity less than the inside field intensity, the side surface of a semiconductor substrate where a PN junction is exposed can be effectively bevelled with respect to the PN junction. It is also known that in the case of a positive bevel where the higher impurity concentration side region has a larger cross section as it departs from a PN junction, the angle between the PN junction surface and the side edge surface on the lower impurity concentration side is preferably 15° to 60°, and that in the case of a negative bevel where the higher impurity concentration side region has a smaller cross section as it departs from a PN junction, the angle between the PN junction surface and the side edge surface on the lower impurity concentration side is preferably 170° to 180° (0° to 10° when seen on the higher impurity concentration side). The details are disclosed in U.S. Pat. Nos. 3,179,860 and 3,361,943 (German Pat. Nos. 1,464,622 and 1,212,215).

In conventional thyristors of a high blocking voltage, both forward and reverse characteristics are needed and a PN junction between a P-type emitter layer and an N-type base layer is formed in a positive bevel of 15° to 60° and another PN junction between the N-type base layer and the P-type base layer is formed in a negative bevel of 0° to 10°. Such structures where a positive and a negative bevel are formed in the side surface of a semiconductor substrate are called double bevel structures since, the bevelled surface is formed in two stages. In the double bevel structure, the area of that principal surface which is on the N-type emitter layer side becomes much smaller than that on the P-type emitter layer side and hence the maximum current capacity is determined by the area of the N-type emitter layer. Thus, semiconductor devices of double bevel structure have a drawback that the maximum current capacity for a semiconductor substrate of a certain dimension is small. Further, in double bevel structure, when the breakover and breakdown voltages are desired to be of equal magnitude the angle for the negative bevel should be about 1° or less. This results in another drawback that high quality techniques are needed for obtaining such bevel angles with good reproducibility.

Thus, for eliminating such drawbacks there has been proposed a method in which the side surface of a semiconductor disk is formed in pulley-shape or V-shape (hereinafter referred as pulley-shape) to form positive bevels for the respective PN junctions, as disclosed in U.S. Pat. No. 3,491,272, especially FIG. 16 thereof. However, few studies have been made on the bevel structure of pulley-shaped side surfaces except to show that the blocking voltage of a semiconductor can be determined by that inside the semiconductor substrate by increasing the depth of the valley portion of the pulley-shape to a certain degree, i.e., decreasing the bevel angle of the PN junction surface and thereby decreasing the intensity of surface electric field and that there would be an appropriate range for the depth of the valley portion since excessive depth invites an increase in the intensity of the surface electric field in the valley portion, reductions in the area of current flow and the mechanical strength. Therefore, it has been difficult to employ the pulley-shaped bevel structure and to design and manufacture semiconductor devices having predetermined blocking voltages for various specifications and to make optimum utilization of semiconductor substrates for a predetermined current flow.

SUMMARY OF THE INVENTION

An object of this invention is to provide a multi-layer type semiconductor device having a novel bevel structure for the side edge surface of a semiconductor substrate.

Another object of this invention is to provide a multi-layer type semiconductor device comprising a semiconductor substrate having such side surface structure that allows the blocking voltage of the device to be determined by that inside the semiconductor substrate.

A further object of this invention is to provide a multi-layer type semiconductor device of a blocking voltage higher than 1000 volts.

A yet further object of this invention is to provide a multi-layer type semiconductor device of a high blocking voltage and large current capacity.

Another object of this invention is to provide a multi-layer type semiconductor device enabling a high utilization ratio of semiconductor substrate for a predetermined current capacity.

Another object of this invention is to provide a multi-layer type semiconductor device of compact size.

Another object of this invention is to provide a multi-layer type semiconductor device comprising a semiconductor substrate having a side surface structure of low manufacturing cost.

DESCRIPTION OF PREFERRED EMBODIMENTS

Now, description will be made on preferred embodiments of this invention in connection with the accompanying drawings.

Figure 1:
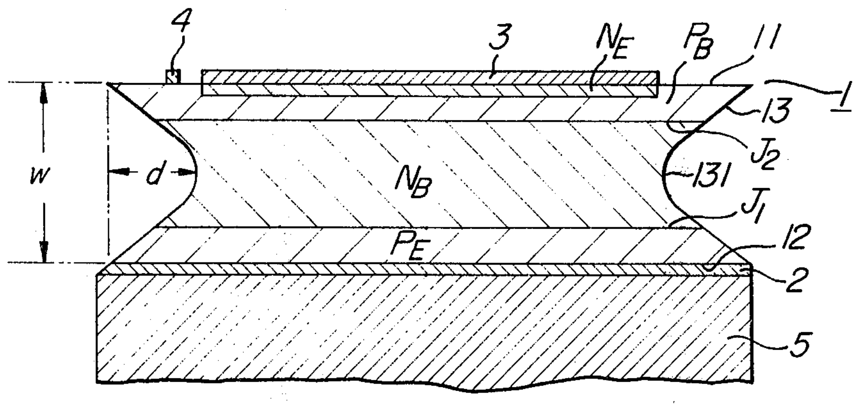
FIG. 1 is a schematic cross-section showing an embodiment of a semiconductor device according to this invention.

FIG. 1 shows a four-layer three-terminal semiconductor device according to the invention, i.e., a reversely blocking type thyristor. A semiconductor substrate 1 has such a shape that is limited by a pair of mutually parallel and opposing principal surfaces 11 and 12 and a pulley-shaped side surface 13 connecting the two principal surfaces 11 and 12 and comprises continuously four layers of alternately different conductivity types indicated by $P_E$, $N_B$, $P_B$ and $N_E$. At least those PN junctions $J_1$ and $J_2$ which are formed between the layers $P_E$ and $N_B$, and $N_B$ and $P_B$ are exposed on the side surfaces. Further, the valley portion 131 (the deepest portion) of the pulley-shape is formed substantially in the middle of the layer $N_B$. These layers $P_E$, $N_B$, $P_B$ and $N_E$ are a P-type emitter, N-type base, P-type base and N-type emitter layers laminated in this order. Here, the N-type emitter layer $N_E$ is embedded in the P-type base layer $P_B$, and the P-type base and P-type emitter layers $P_B$ and $P_E$ have a higher impurity concentration than that of the N-type base layer $N_B$. The semiconductor substrate having such a junction construction as above is conventionally fabricated by the steps of preparing an N-conductivity type semiconductor wafer of a substantially constant impurity concentration, diffusing an impurity material imparting a P-type conductivity such as gallium or boron into the wafer from both surface to a predetermined depth therein, so as to thereby form a P-type base layer $P_B$ and a P-type emitter layer $P_E$. Then an impurity material imparting an N-type conductivity such as phosphorus arsenic or antimony is diffused or alloyed into or with the P-type base layer $P_B$ from its one surface to a predetermined depth, so as to form an N-type emitter layer $N_E$. Rarely, the layers $P_B$, $P_E$, $N_E$ may be formed by the vapor growth method. The remaining N-conductivity type region between the P-type base layer $P_B$ and the P-type emitter layer $P_E$ is employed as the N-type base layer $N_B$. Accordingly the following impurity concentration profile can be obtained. The N-type base layer $N_B$ has the lowest impurity concentration among the four layers, and the impurity concentration is uniform. Each of the P-type base layer $P_B$ and the P-type emitter layer $P_E$ has a higher impurity concentration than that of the N-type base layer $N_B$ and, in these P-type base and emitter layers, the impurity concentration becomes higher the farther away from the N-type base layer, and the N-type emitter layer $N_E$ has a higher impurity concentration than that of the P-type base layer $P_B$. The thicknesses and impurity concentrations of the P-type emitter, N-type base and P-type base layers are so determined in accordance with the voltage used of the device that when the PN junction $J_1$ or $J_2$ is reversely biased the greater part of the depletion layer (more than 90 percent) exists in the N-type base layer and spreads beyond the middle of the N-type base layer. An anode electrode 2 is brought into ohmic contact with one principal surface 12 of the substrate 1, i.e., the surface of the P-type emitter layer $P_E$. A cathode electrode 3 is brought into ohmic contact with the other principal surface 11, or more particularly the surface of the N-type emitter layer $N_E$. On the principal surface 11, a control electrode 4 is formed in ohmic contact with the P-type base layer $P_B$. The semiconductor substrate 1 is fixed on a support 5 which has an approximately equal thermal expansion constant with the semiconductor substrate 1, using the anode of electrode 2 as an adhesive.

The side surface of this semiconductor substrate 1 is formed in such a pulley-shape which satisfies $$10^{\{0.428 \times (\log\epsilon)^2 + 0.0133 \times \log\epsilon - 0.783\}} \leq d/w \leq 1 \qquad (1)$$

where, *w* represents the thickness of the substrate (the distance between the two principal surfaces), *d* the depth of the valley portion of the pulley-shape, $\epsilon$ the specific dielectric constant of the ambient atmosphere, and log the logarithm to base 10. The reason why the side surface of the substrate 1 is formed in such a pulley-shaped that satisfies equation (1) will become apparent in the following description.

Figure 3:
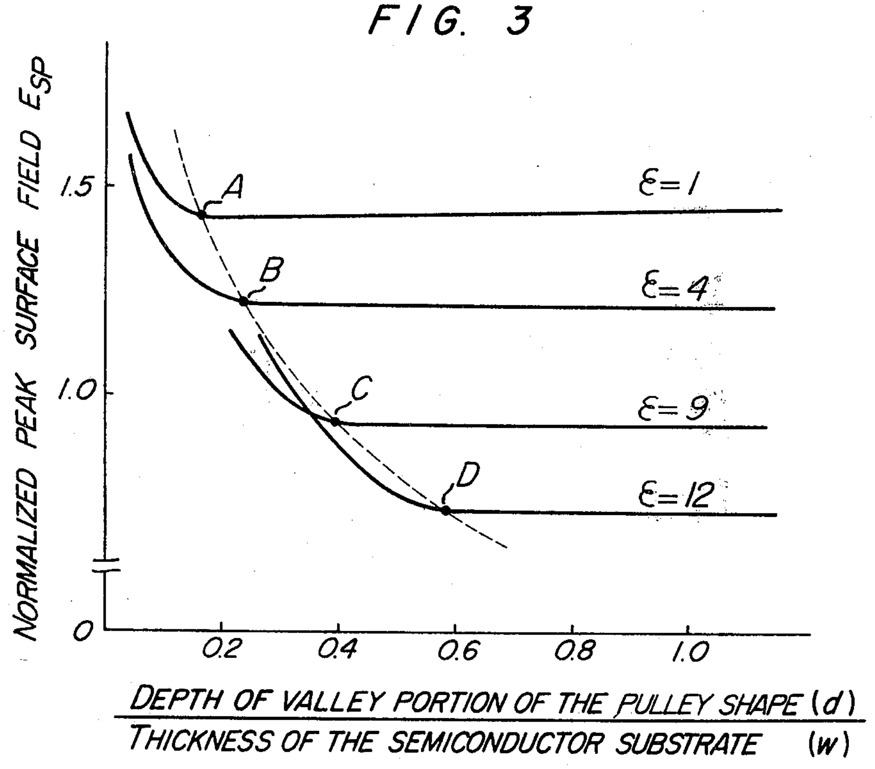
FIG. 3 shows characteristic curves representing the relationship between the normalized peak surface field $E_{sp}$ and the ratio of the depth *d* of the valley portion of the pulley-shape and the thickness *w* of the semiconductor substrate at various values of the specific dielectric constant $\epsilon$ of the ambient atmosphere taken as a parameter.
Figure 2:
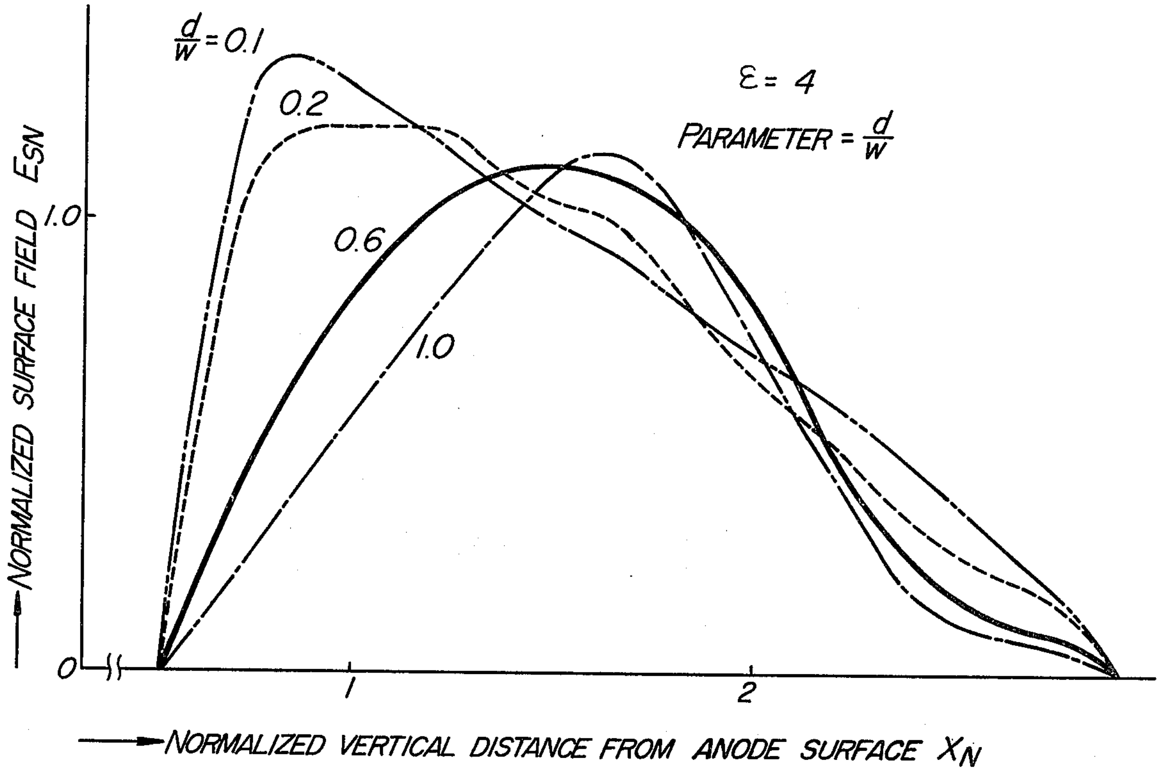
FIG. 2 shows characteristic curves representing the relationship between the normalized vertical distance from the anode surface $X_n$ and the normalized surface field $E_{sn}$ at various values of the ratio of the depth *d* of the valley portion of the pulley-shape and the thickness *w* of the semiconductor substrate taken as a parameter.

The inventors examined the surface field intensity distribution of the semiconductor device the side surface of which is formed into a pulley-shape as shown in FIG. 1 and obtained results such as shown in FIGS. 2 and 3. FIG. 2 shows the relationship between the normalized vertical distance from the anode surface $X_n$ and the normalized surface field $E_{sn}$ at various values of the ratio of the depth *d* of the valley portion of the pulley-shape and the thickness *w* of the semiconductor substrate taken as a parameter. In FIG. 2, it is assumed that the specific dielectric constant of dielectric material filled into the valley portion is four (4).

The normalized vertical distance $X_n$ is given by the following formulaa:

$$X_n = X/w_s$$

where *X* is the actual vertical distance from the anode surface and $w_s$ is the depletion layer width of the step junction. The $w_s$ does not represent the real depletion layer width as explained in the present specification, but is only a measure of the length of the present semiconductor device. The $w_s$ is represented by the following formula:

$$w_s = \sqrt{\frac{2\epsilon_o \cdot \epsilon_{si} \cdot V_a}{q \cdot N_b}},$$

where *q* is the electronic charge, $\epsilon_o$ the dielectric constant in vacuum, $\epsilon_{si}$ the specific dielectric constant of silicon, $N_b$ the impurity concentration of the N-type base layer, and $V_a$ is the applied voltage.

The normalized surface field $E_{sn}$ is given by the following formula:

$$E_{sn} = E_s \cdot w_s / V_a,$$

where $E_s$ is the actual surface field in volts per centimeter, $V_a/w_s$ is the normalized factor for the electric field, and $V_a$ is the applied voltage.

From FIG. 2, it will be understood that the peak of the surface field exists in the neighbourhood of the PN junction $J_1$ when the depth of the valley portion is shallow and, as it is made deeper the peak of the surface field appears at the valley portion, and that the peak value is not decreased but becomes constant even if the depth of the valley portion is made much deeper exceeding a certain extent.

FIG. 3 shows the normalized peak surface field $E_{sp}$vs. the ratio $d/w$ of the valley depth $d$ of the pulley-shape and the thickness $w$ of the semiconductor substrate relation curves at various values of the specific dielectric constant of dielectric material filled into the valley portion used as a parameter. The normalized peak surface field $E_{sp}$ is obtained from the following relationship:

$$E_{sp} = E_p \cdot w_s / V_a,$$

where $E_p$ is the actual peak surface field in volts per centimeter. Since, in such multi-layer type semiconductor device of a high blocking voltage as in the present invention, the greater part of the depletion layer spreads into the N-type base layer $N_B$ as already described, the width of the depletion layer spreading into the $N_B$ layer becomes nearly equal and in proportion to the value of the above $w_s$.

It can be seen from these characteristic curves that the normalized peak surface field $E_{sp}$ becomes approximately constant when the ratio $d/w$ of the valley depth $d$ to the thickness $w$ of the semiconductor substrate exceeds certain values (those values at points A, B, C and D for the respective curves). The minimum ratio $(d/w)_{min.}$ of the valley depth $d$ and the substrate thickness w, i.e., those values at points A, B, C and D and the specific dielectric constant $\epsilon$ of the ambient atmosphere around the side surface are found to satisfy the relation $$10^{\{0.428 \times (\log\epsilon)^2 + 0.0133 \times \log\epsilon - 0.783\}} \cong (d/w)_{min.} \quad (2)$$

where the logarithm is taken to base 10. Thus, for depressing the surface field intensity at the side surface of a semiconductor substrate of pulley-shape to a predetermined value with good reproducibility, the ratio $d/w$ of the valley depth $d$ and the substrate thickness $w$ is selected to satisfy $$10^{\{0.428 \times (\log\epsilon)^2 + 0.0133 \times \log\epsilon - 0.783\}} \cong (d/w)_{min.} \quad d/w \quad (3)$$

An explanation will be made of the fact that the normalized peak surface field $E_{sp}$, represented on the ordinate of FIG. 3, is not affected by any change of the impurity concentration of the N-type base layer and/or the applied voltage.

Figure 4:
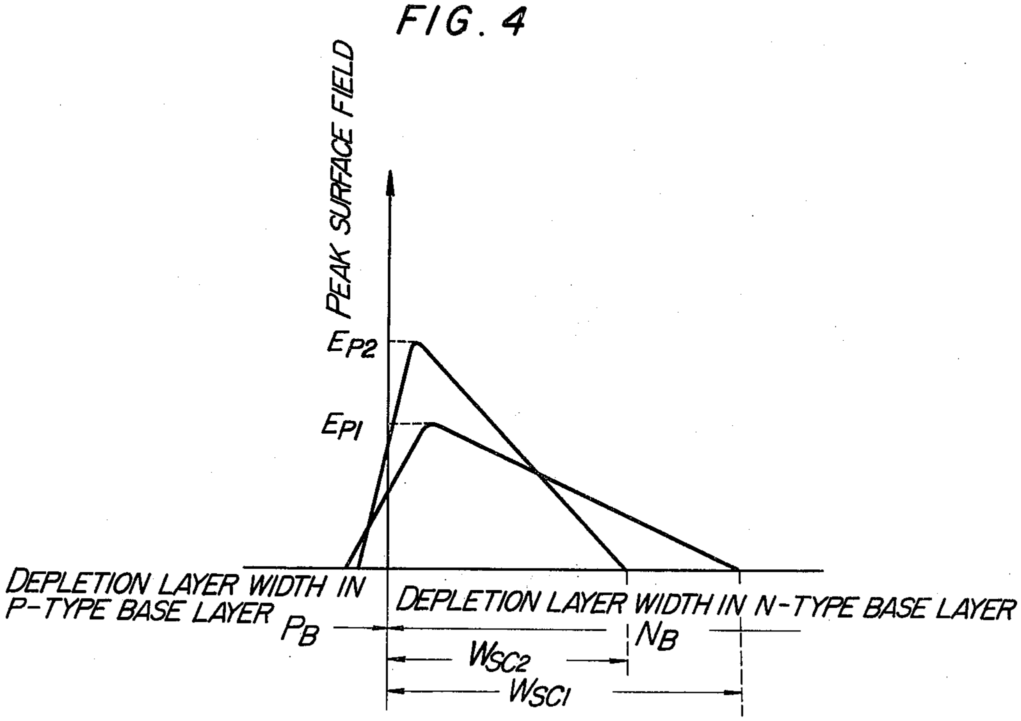
FIG. 4 is a graph showing the relationship between the spread of the depletion layer in the neighbourhood of the N-type base layer and the peak surface field.

For example, in case the impurity concentration of the N-type base layer $N_b$ is doubled while the applied voltage $V_a$ is maintained constant, the $w_s$ is multiplied by $1/\sqrt{2}$ as seen from the above equation representing $w_s$. The $E_p$ can be calculated from FIG. 4. Namely, assuming that the peak surface field is $E_{p1}$ and $E_{p2}$ and the depletion layer width in the N-type base layer is $w_{sc1}$ and $w_{sc2}$ in the case of the impurity concentration of the N-type base layer being $N_b$ and $2N_b$, respectively, the following equation can approximately be obtained:

$$V_a = ½\, E_{p1} \cdot W_{sc1} = ½\, E_{p2} \cdot W_{sc2}$$

In a semiconductor device of a high blocking voltage, the depletion layer width in the N-type base layer is nearly equal and in proportion to $w_s$, and therefore the following relation is obtained:

$$W_{sc1} : W_{sc2} = 1 : 1/\sqrt{2}$$

Thus, the relationship between $E_{p1}$ and $E_{p2}$ is as follows:

$$E_{p1} : E_{p2} = 1/\sqrt{2} : 1$$

In other words, when the $N_b$ is doubled, the $E_p$ is multiplied by 2. Therefore, it will be understood from the above equation representing $E_{sp}$ that the $E_{sp}$ is not varied even if the $N_b$ is changed.

Considering another case where the applied voltage $V_a$ is doubled while the impurity concentration of the N-type base layer $N_b$ is maintained constant, for example, the $W_s$ is multiplied by $\sqrt{2}$ as apparent from the above equation representing $W_s$, and the $E_p$ is also multiplied by $\sqrt{2}$ in accordance with the same discussion as in the above-mentioned case. Therefore, it will also be understood from the above equation representing $E_{sp}$ that the $E_{sp}$ is not varied even if the $V_a$ is changed.

Thus, the relational equation obtained by curves connecting the points A, B, C and D in FIG. 3 is established at all times in the case of semiconductor devices having a blocking voltage higher than 1000 volts in which more than 90 percent of the depletion layer spreads in the N-type base layer.

On the other hand, the sand blast method in which abrasive powder such as alumina powder is blasted from a thin nozzle to a substrate side surface, is found most preferable for forming a side surface in pulley-shape in the point that it provides good reproducibility. According to this method, until the valley depth $d$ becomes approximately equal to the substrate thickness $w$ both the reproducibility and the efficiency are good, but when the valley depth $d$ becomes larger than the substrate thickness $w$, reproducibility for the pulley-shape becomes worse and further those portions where the side surface meets the principal surfaces become thin and mechanically weak, and thus can be easily broken.

A further deepening of the valley depth results in a reduction in the area for current flow and thus the effects of employing the pulley-shaped bevel structure in place of the double bevel structure are largely lost.

Therefore, when employing the pulley bevel structure, the ratio of the valley depth $d$ to the substrate thickness $w$ is preferably selected in the range $d/w \leqq 1$ in view of reproducibility and efficiency and in obtaining a desired pulley-shape with a large area for current flow.

From the above considerations, when industrially making semiconductor devices comprising a semiconductor substrate having a pulley-shaped side surface structure, the ratio of the valley depth *d* of the pulley-shape to the thickness *w* of a semiconductor substrate is preferably selected in the range $$10^{\{0.428 \times (\log\epsilon)^2 + 0.0133 \times \log\epsilon - 0.783\}} \leqq d/w \leqq 1$$

where $\epsilon$ represents the specific dielectric constant of the atmosphere around the side surface.

According to this invention as described above, there can be provided a semiconductor device of a high blocking voltage and large current capacity relative to the dimension of the semiconductor substrate. For example, in making a thyristor of a blocking voltage of 4000V using a silicon substrate of diameter 40 mm and thickness 1 mm, the current capacity is 350 A according to the conventional two stage bevel structure, whereas it becomes 500 A, 1.4 times as large as the conventional one, according to the inventive pulley-shaped bevel structure. As the blocking voltage is increased, i.e., the thickness of the semiconductor substrate is increased, the difference of the current capacity for the two cases becomes larger.

Thus, for providing semiconductor devices of a predetermined blocking voltage and current capacity, smaller semiconductor substrates can be used according to the invention, which yields a reduction in the manufacturing cost together with an improved processing efficiency.

Further, in case of designing the surface structure of a semiconductor element having a predetermined high blocking voltage, according to the conventional structure only the bevel angle was decreased to weaken the surface field intensity, whereas according to the inventive structure the depth of the valley portion may be determined also taking into account of the dielectric constant of the atmosphere around the side surface. Thus, the surface structure can be advantageously determined considering the manufacturing efficiency and thereby the manufacturing efficiency can be improved compared with that of the conventional structure.

Figure 5:
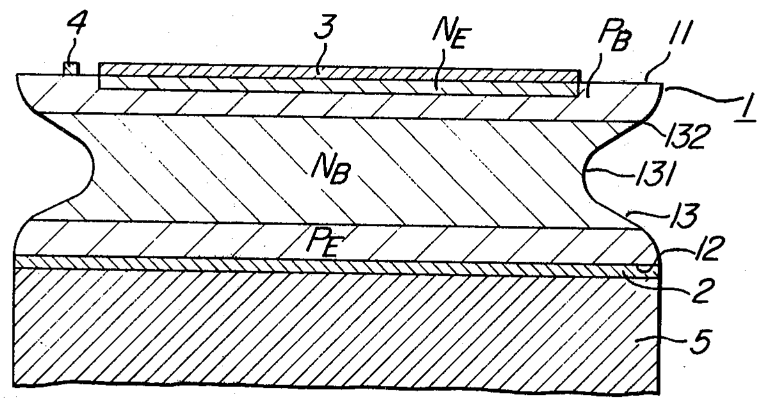
FIGS. 5 and 6 are schematic cross-sections of other embodiments of semiconductor devices according to the invention.

FIG. 5 shows another embodiment of a semiconductor device comprising a semiconductor substrate of pulley-shape which satisfies the relation of equation (1) and in which inflection points lie near exposed PN junction surfaces. In FIG. 5, similar numerals as those in FIG. 1 indicate similar parts.

Inflection point 132 is formed near a PN junction exposed on the side surface and the bevel angle on the principal surface side is formed larger than that on the valley side.

Comparing the pulley-shapes of FIGS. 1 and 5, the peak surface field can be made smaller in the case of FIG. 5 than that of FIG. 1. This is because in FIG. 1 the maximum point of the surface field exists only at the valley portion whereas in FIG. 5 another maximum occurs at the inflection point which carries an appreciable amount of voltage. Further, the mechanical strength of the semiconductor substrate is also larger in the case of FIG. 5 than FIG. 1. Thus, the structure of FIG. 5 enables easier mechanical treatment and provides a better yield.

Figure 6:
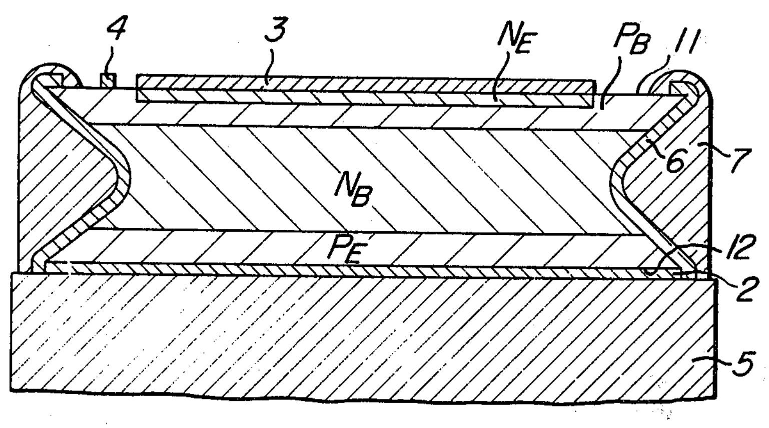

FIG. 6 shows yet another embodiment of a semiconductor device having a pulley-shaped side surface which satisfies the relation of equation (1) and is covered with a layer 6 of a low dielectric constant and another layer 7 of a high dielectric constant.

As is described above, the surface of a semiconductor substrate is active and hence sensitive to the influence of the ambient atmosphere. Thus, generally the surface of semiconductor devices are covered with a dielectric film such as silicon dioxide or silicon nitride to passivate the surface state. In power semiconductor devices, uniformalization of the surface field distribution and reduction in the surface field intensity is required besides the passivation of the surface.

In the description on the devices of FIGS. 1 and 5, it has been assumed that the dielectric strength of the ambient atmosphere is larger than the surface field intensity of the substrate. In devices of high blocking voltages, however, the ambient atmosphere, for example, air may cause dielectric breakdown. Then, regardless of the shape of side surface the blocking voltage of the device is solely determined by the dielectric breakdown voltage of the atmosphere and it becomes impossible to make a device having a higher blocking voltage than the breakdown voltage of the ambient dielectric atmosphere. The easiest way to solve the above problem would be placing the semiconductor device in an atmosphere of a high dielectric breakdown or covering the side surface of the device with a dielectric substance of a high dielectric breakdown. In the latter method, it is to be noted that a leakage current might be allowed to flow through the substrate surface when covered with a dielectric substance of a high dielectric breakdown. The device shown in FIG. 6 has solved this problem. Namely, the cover layer 6 of smaller dielectric constant, for example, silicon dioxide (specific dielectric constant 4.5), is formed first on the side surface of a semiconductor substrate and then the cover member 7 of a higher dielectric constant, for example, a mixture of barium titanate (specific dielectric constant 10 to 18) in silicone rubber is formed on the cover layer 6 so as to fill up the valley portion. The cover layer 6 works to reduce the leakage current and the cover member 7 works to reduce the surface field intensity and makes the occurrance of space discharge difficult by elongating the discharge path.

In the foregoing, discription has been made only on four-layer three-terminal semiconductor devices, but this invention is in no way limited to those but can be adapted similarly to semiconductor devices of other type, e.g. four-layer two-terminal type.

What is claimed is:

1. In a semiconductor device of a high blocking voltage comprising: a semiconductor substrate having a pair of mutually opposing principal surfaces disposed substantially in parallel with each other and a side surface connecting the principal surfaces and including between said pair of principal surfaces at least a first layer of one conductivity type, a second layer of the other conductivity type having in a uniform distribution a lower impurity concentration than that of said first layer, disposed adjacent to and forming a first PN junction with said first layer, and a third layer of said one conductivity type having a higher impurity concentration than that of said second layer, disposed adjacent to and forming a second PN junction with said second layer, said first and second PN junctions being exposed at said side surface, said side surface being formed into a pulley-shape the valley portion of which is located substantially at the middle of said second layer; a cover member of a high dielectric constant filling up the valley portion of the pulley shape; and a pair of main electrodes provided respectively in ohmic contact with said principal surfaces, in which the greater part of a depletion layer produced when the first or second PN junction is reversely biased exists in said second layer and spreads beyond said valley portion; the improvement comprising the fact that said pulley shape of the side surface satisfies the condition $$10^{\{0.428 \times (\log\epsilon)^2 + 0.0133 \times \log\epsilon - 0.783\}} \leqq d/w,$$

where $d$ represents the depth of the valley portion, $w$ the thickness of the semiconductor substrate, and $\epsilon$ the specific dielectric constant of the atmosphere around the valley portion, and wherein the ratio $d/w$ of the valley depth to the substrate thickness is not larger than unity.

2. A semiconductor device according to claim 1, further comprising a cover layer of a dielectric constant lower than that of said cover member covering the side surface of the pulley-shape.

3. A semiconductor device according to claim 1, wherein said semiconductor substrate further comprises a fourth layer of said other conductivity type, having a higher impurity concentration than that of said third layer, embedded in and forming a third PN junction with said third layer, and having a surface aligned with a corresponding one of said principal surfaces so as to be exposed, one of said main electrodes being disposed on said exposed surface of said fourth layer.

4. A semiconductor device according to claim 3, further comprising a cover layer of a dielectric constant lower than that of said cover member covering the side surface of the pulley-shape.

5. A semiconductor device according to claim 3, further comprising a control electrode disposed on the principal surface from which said fourth layer is exposed, apart from the main electrode provided on the surface of said fourth layer.

6. A semiconductor device according to claim 3, wherein inflection points are formed in the pulley-shape near the exposed first and second PN junctions.

7. A semiconductor device according to claim 6, further comprising a cover layer of a dielectric constant lower than that of said cover member covering the side surface of the pulley-shape.

8. A semiconductor device according to claim 6, further comprising a control electrode disposed on the principal surface from which said fourth layer is exposed, apart from the main electrode provided on the surface of said fourth layer.

9. In a semiconductor device of a high blocking voltage comprising: a semiconductor substrate having a pair of mutually opposing principal surfaces disposed substantially in parallel with each other and a side surface connecting the principal surfaces and including between said pair of principal surfaces a first layer of one conductivity type, a second layer of the other conductivity type having in a uniform distribution a lower impurity concentration than that of said first layer, disposed adjacent to and forming a first PN junction with said first layer, a third layer of said one conductivity type having a higher impurity concentration than that of said second layer, disposed adjacent to and forming a second PN junction with said second layer, and a fourth layer of said other conductivity type, having a higher impurity concentration than that of said third layer, embedded in and forming a third PN junction with said third layer, and having a surface aligned with a corresponding one of said principal surfaces so as to be exposed, said first and second PN junctions being exposed at said side surface, said side surface being formed into a pulley-shape the valley portion of which is located substantially at the middle of said second layer; a cover member of a high dielectric constant filling up the valley portion of the pulley-shape; and a pair of main electrodes provided in ohmic contact with said first and fourth layers on said principal surfaces, respectively, in which the greater part of a depletion layer produced when the first or second PN junction is reversely biased exists in said second layer and spreads beyond said valley portion; the improvement comprising the fact that the ratio $d/w$ of the depth $d$ of the valley portion to the thickness $w$ of the semiconductor substrate is larger than the value corresponding to the line connecting points A, B, C and D of FIG. 3, and wherein the ratio $d/w$ of the valley depth to the substrate thickness is not larger than unity.

10. A semiconductor device according to claim 9, further comprising a cover layer of a dielectric constant lower than that of said cover member covering the side surface of the pulley-shape.

11. A semiconductor device according to claim 9, further comprising a control electrode disposed on the principal surface from which said fourth layer is exposed, apart from the main electrode provided on the surface of said fourth layer.

12. A semiconductor device according to claim 10, further comprising a control electrode disposed on the principal surface from which said fourth layer is exposed, apart from the main electrode provided on the surface of said fourth layer.

* * * * *